United States Patent
Yokoyama et al.

(10) Patent No.: US 9,496,848 B2
(45) Date of Patent: Nov. 15, 2016

(54) PIEZOELECTRIC THIN-FILM RESONATOR, FILTER AND DUPLEXER UTILIZING A PIEZOELECTRIC FILM HAVING AN AIR SPACE

(71) Applicant: TAIYO YUDEN CO., LTD., Tokyo (JP)

(72) Inventors: Tsuyoshi Yokoyama, Tokyo (JP); Tokihiro Nishihara, Tokyo (JP); Takeshi Sakashita, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 14/527,273

(22) Filed: Oct. 29, 2014

(65) Prior Publication Data

US 2015/0130560 A1 May 14, 2015

(30) Foreign Application Priority Data

Nov. 11, 2013 (JP) .................................. 2013-233232

(51) Int. Cl.
| | |
|---|---|
| H03H 9/70 | (2006.01) |
| H03H 9/54 | (2006.01) |
| H03H 9/15 | (2006.01) |
| H03H 9/17 | (2006.01) |
| H03H 9/02 | (2006.01) |
| H03H 9/58 | (2006.01) |
| H01P 5/02 | (2006.01) |
| H01P 7/08 | (2006.01) |
| H01P 11/00 | (2006.01) |

(52) U.S. Cl.
CPC ......... *H03H 9/706* (2013.01); *H03H 9/02015* (2013.01); *H03H 9/02118* (2013.01); *H03H 9/173* (2013.01); *H03H 9/175* (2013.01); *H03H 9/587* (2013.01); *H03H 9/589* (2013.01); *H01P 5/028* (2013.01); *H01P 7/082* (2013.01); *H01P 11/008* (2013.01)

(58) Field of Classification Search
CPC ..................... H03H 9/02015; H03H 9/02047; H03H 9/02086; H03H 9/02118; H03H 9/131; H03H 9/132; H03H 9/173; H03H 9/174; H03H 9/175; H03H 9/568; H03H 9/587; H03H 9/588; H03H 9/589; H03H 9/70; H03H 9/703; H03H 9/706; H03H 9/54; H03H 9/564; H03H 9/58; H03H 9/582; H03H 9/586
USPC .......................................... 333/133, 187, 189
See application file for complete search history.

(56) References Cited

U.S. PATENT DOCUMENTS

| | | | |
|---|---|---|---|
| 7,477,001 B2 * | 1/2009 | Sato ................... | H03H 9/02133 310/320 |
| 7,482,738 B2 * | 1/2009 | Taniguchi ................ | H03H 3/02 310/320 |

(Continued)

FOREIGN PATENT DOCUMENTS

JP    2006-109472 A    4/2006

*Primary Examiner* — Barbara Summons
(74) *Attorney, Agent, or Firm* — Chen Yoshimura LLP

(57) ABSTRACT

A piezoelectric thin-film resonator includes, a substrate, a piezoelectric film provided on the substrate, and a lower electrode and an upper electrode that face each other through the piezoelectric film. The piezoelectric film has an air space that is provided in at least part of an outer circumferential part of a resonance region in which the upper and lower electrodes face each other through the piezoelectric film and is not provided in a central part of the resonance region.

10 Claims, 11 Drawing Sheets

(56) References Cited

U.S. PATENT DOCUMENTS

| | | | | |
|---|---|---|---|---|
| 7,889,027 B2* | 2/2011 | Oka | ............... | H03H 9/02102 310/365 |
| 2002/0121405 A1* | 9/2002 | Ruby | ............... | H03H 3/02 181/293 |
| 2006/0091764 A1* | 5/2006 | Tsutsumi | ............... | H03H 9/02118 310/324 |
| 2006/0103492 A1 | 5/2006 | Feng et al. | | |
| 2006/0202779 A1* | 9/2006 | Fazzio | ............... | B81C 1/00246 333/187 |
| 2009/0206706 A1* | 8/2009 | Iwaki | ............... | H03H 9/174 310/365 |
| 2010/0033063 A1* | 2/2010 | Nishihara | ............... | H03H 9/02118 310/365 |
| 2010/0088868 A1* | 4/2010 | Kando | ............... | H01L 41/257 29/25.35 |
| 2010/0109809 A1* | 5/2010 | Tanaka | ............... | H03H 9/132 333/187 |
| 2010/0148636 A1* | 6/2010 | Nishihara | ............... | H03H 9/02015 310/365 |
| 2012/0161902 A1* | 6/2012 | Feng | ............... | H03H 9/02118 333/187 |
| 2012/0218059 A1* | 8/2012 | Burak | ............... | H03H 9/132 333/191 |
| 2012/0218060 A1* | 8/2012 | Burak | ............... | H03H 3/04 333/191 |

* cited by examiner

WIDTH W OF OVERLAP BETWEEN
RESONANCE REGION AND AIR SPACE [μm]

WIDTH W OF OVERLAP BETWEEN
RESONANCE REGION AND AIR SPACE [μm]

PIEZOELECTRIC THIN-FILM RESONATOR, FILTER AND DUPLEXER UTILIZING A PIEZOELECTRIC FILM HAVING AN AIR SPACE

CROSS-REFERENCE TO RELATED APPLICATION

This application is based upon and claims the benefit of priority of the prior Japanese Patent Application No. 2013-233232, filed on Nov. 11, 2013, the entire contents of which are incorporated herein by reference.

FIELD

A certain aspect of the present invention relates to a piezoelectric thin-film resonator, a filter and a duplexer.

BACKGROUND

A piezoelectric thin-film resonator, which is one of the acoustic wave devices, is used in, for example, a filter and a duplexer of wireless devices such as cellular phones. The piezoelectric thin-film resonator has a structure in which a lower electrode and an upper electrode face each other through a piezoelectric film.

Due to the rapid spread of wireless systems, many frequency bands have been used. Thus, there is a growing demand for the improvement in the steepness of the skirt characteristics of filters and duplexers. A measure for improving the steepness of the skirt characteristics is to increase the Q value of the piezoelectric thin-film resonator. A factor that degrades the Q value of the piezoelectric thin-film resonator is a leakage of acoustic wave energy from the resonance region to the outside. For the improvement of the Q value, there is a proposal to position a raised annulus on a surface of the lower electrode or the upper electrode (see Japanese Laid-Open Patent Application No. 2006-109472, for example).

However, the structure proposed in the above application has a difficulty in effective suppression of the acoustic wave energy leaked to the outside from the resonance region and an insufficiency in the improvement of the Q value.

SUMMARY OF THE INVENTION

According to an aspect of the present invention, the Q value is improved.

According to another aspect of the present invention, there is provided a piezoelectric thin-film resonator including: a substrate; a piezoelectric film provided on the substrate; and a lower electrode and an upper electrode that face each other through the piezoelectric film, the piezoelectric film having an air space that is provided in at least part of an outer circumferential part of a resonance region in which the upper and lower electrodes face each other through the piezoelectric film and is not provided in a central part of the resonance region.

According to yet another aspect of the present invention, there is provided a filter including the above piezoelectric thin-film resonator.

According to a further aspect of the present invention, there is provided a duplexer including a transmit filer and a receive filter, wherein one of the transmit and receive filters includes the above filter.

DETAILED DESCRIPTION

A description is now given of embodiments of the present invention in conjunction with the accompanying drawings.

First Embodiment

Figure 1A:
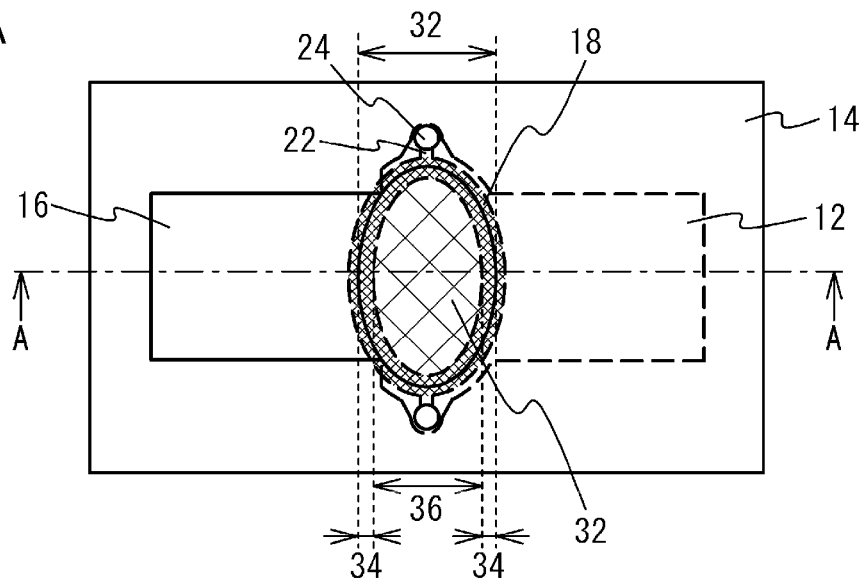
FIG. 1A is a top view of a piezoelectric thin-film resonator in accordance with a first embodiment.
Figure 1B:
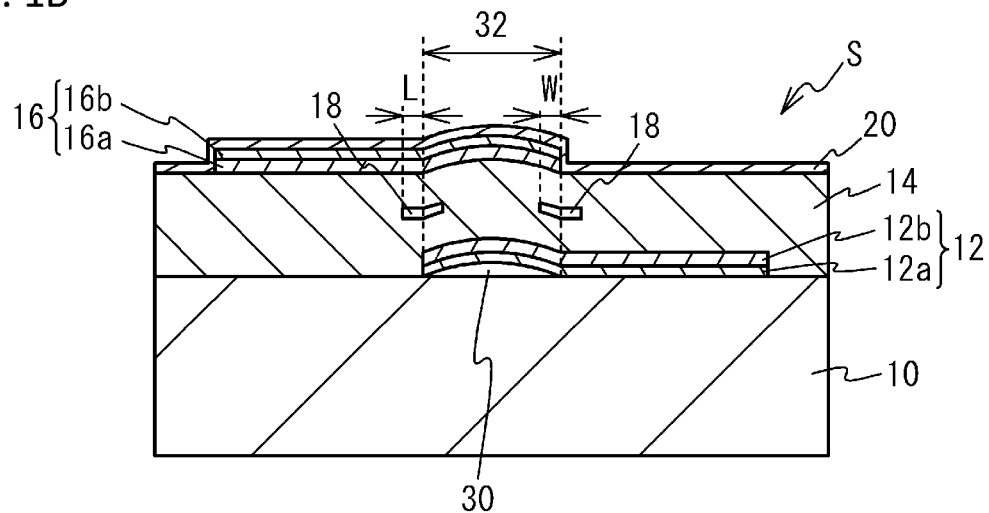
FIGS. 1B and 1C are cross-sectional views taken along a line A-A in FIG. 1A.
Figure 1C:
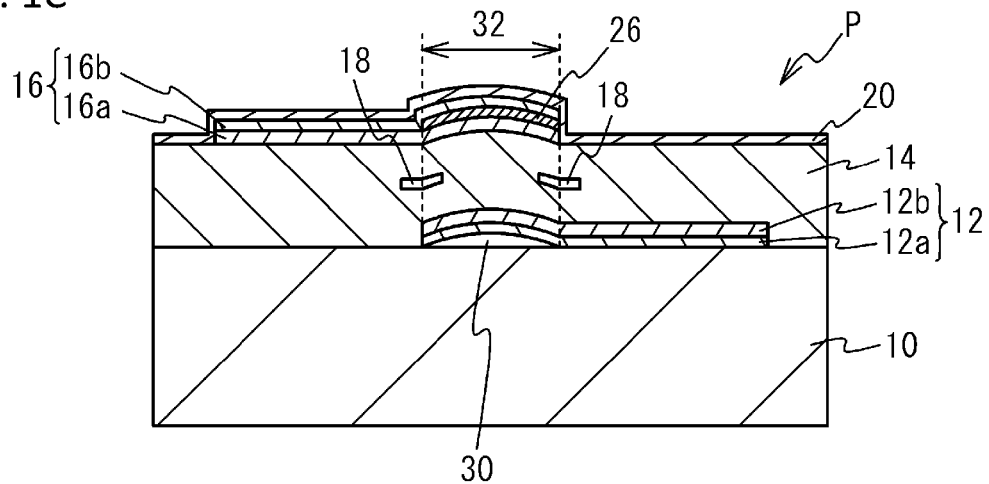

FIG. 1A is a top view of a piezoelectric thin-film resonator in accordance with a first embodiment, and FIGS. 1B and 1C are respectively cross-sectional views taken along lines A-A in FIG. 1A. FIG. 1B illustrates a cross section of a series resonator of a ladder filter, and FIG. 1C illustrates a cross section of a parallel resonator of the ladder filter, for example.

As illustrated in FIGS. 1A and 1B, a series resonator S has a lower electrode 12 formed on a substrate 10, which is a silicon substrate, for example. An air gap 30 is formed between a flat main surface of the substrate 10 and the lower electrode 12. The air gap 30 has a dome-shaped bulge on the lower electrode 12 side. The dome-shaped bulge has a relatively small height in the periphery and has a larger height in a farther inside position from the periphery. The lower electrode 12 includes a lower layer 12a and an upper layer 12b. For example, the lower layer 12a is a chromium (Cr) film, and the upper layer 12b is a ruthenium (Ru) film.

On the lower electrode 12, there is provided a piezoelectric film 14, which includes, as the principal component, aluminum nitride (AlN) having the main axis in the (002) direction. An upper electrode 16 is provided on the piezoelectric film 14 so as to face the lower electrode 12 through the piezoelectric film 14 (resonance region 32). In the resonance region 32, the upper electrode 16 overlaps with the lower electrode 12. The upper electrode 16 includes a lower layer 16a and an upper layer 16b. For example, the lower layer 16a is a Ru film, and the upper layer 16b is a Cr film. The resonance region 32 has an elliptical shape, in which acoustic waves of the thickness longitudinal vibration mode resonate.

An air space 18 is formed within the piezoelectric film 14 so as to include an outer circumferential part 34 of the resonance region 32. The air space 18 is not formed in a central part 36 of the resonance region 32. The air space 18 is formed over the whole circumference of the outer circumferential part 34 in the resonance region 32, and extends up to the resonance region 32 from the outer circumferential part 34 within the resonance region 32. The air space 18 is formed in the medial portion of the piezoelectric film 14 in its thickness direction. The air space 18 may be formed in another portion of the piezoelectric film 14 other than the medial portion. The outer circumferential part 34 within the resonance region 32 is a region that is located within the resonance region 32 and includes the circumference of the resonance region 32 and extends along the circumference. The outer circumferential part 34 has a ring shape, for example. The central part 36 of the resonance region 32 is a region that is located within the resonance region 32 and is further in than the outer circumferential part 34 and that includes the center of the resonance region 32. The air space 18 communicates with introduction paths 22 and apertures 24, which will be described later.

A silicon oxide film is provided on the upper electrode 16 as a frequency adjustment film 20. A multilayered film within the resonance region 32 includes the lower electrode 12, the piezoelectric film 14, the upper electrode 16 and the frequency adjustment film 20. The frequency adjustment film 20 may function as a passivation film.

The introduction paths 22 for etching a sacrificing layer are formed in the lower electrode 12 and the piezoelectric film 14. The sacrificing layer is a layer for forming the air gap 30 and the air space 18. The ends of the introduction paths 22 are not covered with the lower electrode 12 and the piezoelectric film 14 but apertures 24 are formed.

As illustrated in FIGS. 1A and 1C, as compared to the series resonator S, the parallel resonator P has a mass load film 26, which is interposed between the lower layer 16a and the upper layer 16b of the upper electrode 16 and is located in the resonance region 32. The mass load film 26 is a titanium (Ti) film, for example. Thus, the multilayered film in the resonance region 32 includes the mass load film formed on the entire surface of the resonance region 32 in addition to the multilayered film of the series resonator S. The other structures of the parallel resonator P are the same as those of the series resonator S, and a description thereof is omitted here.

The difference in the resonance frequency between the series resonator S and the parallel resonator P is adjustable by the thickness of the mass load film 26. The resonance frequencies of both the series resonator S and the parallel resonator P may be adjusted by the thickness of the frequency adjustment films 20.

For example, a piezoelectric thin-film resonator having a resonance frequency of 2 GHz has the following exemplary dimensions. The lower layer 12a of the Cr film of the lower electrode 12 is 100 nm thick, and the upper layer 12b of the Ru film is 250 nm thick. The piezoelectric film 14 of the AlN film has a thickness of 1100 nm, and the air space 18 in the piezoelectric film 14 has a height of 150 nm. The lower layer 16a of the Ru film of the upper electrode 16 is 250 nm thick, and the upper layer 16b of the Cr film is 50 nm thick. The frequency adjustment film 20 of the silicon oxide film has a thickness of 50 nm. The thickness of the mass load film 26 of the Ti film is 120 nm. The thickness of each layer may be appropriately designed for desired resonance characteristics.

The substrate 10 is not limited to the Si substrate but may be a quartz substrate, a glass substrate, a ceramic substrate, a GaAs substrate or the like. Each of the lower electrode 12 and the upper electrode 16 may be a single metal layer of aluminum (Al), titanium (Ti), copper (Cu), molybdenum (Mo), tungsten (W), tantalum (Ta), platinum (Pt), rhodium (Rh) or iridium (Ir), or a multilayered film thereof. The piezoelectric film 14 may be made of zinc oxide (ZnO), lead zirconate titanate (PZT), or lead tantalate ($PbTiO_3$) instead of aluminum nitride. The piezoelectric film 14 may include aluminum nitride as the principal component and another element in order to improve the resonance characteristic and the piezoelectricity. For example, the use of scandium (Sc) as an added element makes it possible to improve the piezoelectricity of the piezoelectric film 14 and improve the effective electromechanical coupling coefficient of the piezoelectric thin-film resonator.

The frequency adjustment film 20 may be a silicon nitride film or an aluminum nitride film besides the silicon oxide film. The mass load film 26 is not limited to Ti but may be a single metal layer of Ru, Cr, Al, Cu, Mo, W, Ta, Pt, Rh or Ir or a multilayered film thereof. The mass load film 26 may be an insulative film such as nitride metal such as silicon nitride or silicon oxide or metal oxide. The mass load film 26 may be formed under the lower electrode 12, between the layers of the lower electrode 12, on the upper electrode 16, between the lower electrode 12 and the piezoelectric film 14, or between the piezoelectric film 14 and the upper electrode 16. The mass load film 26 is required to include the resonance region 32 and may be larger than the resonance region 32.

Figure 2A:
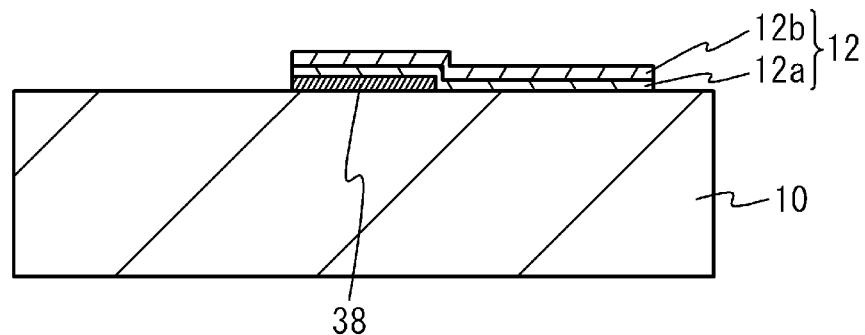
FIGS. 2A through 2C are cross-sectional views that illustrate a method for fabricating the piezoelectric thin-film resonator of the first embodiment.
Figure 2B:
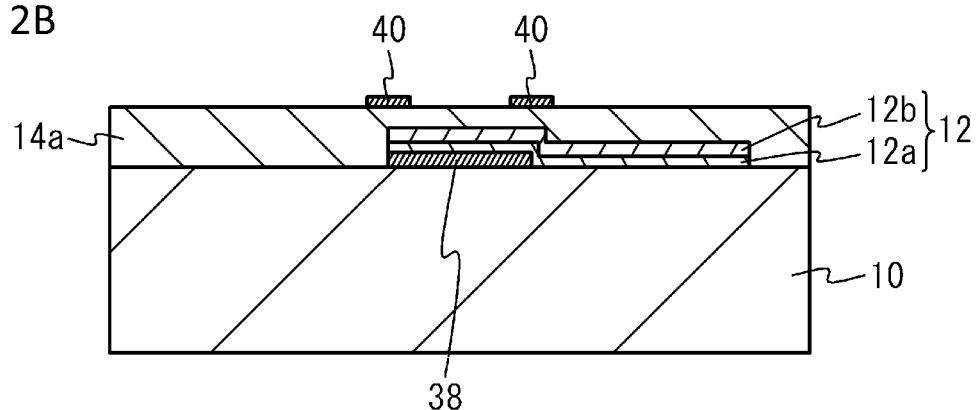
Figure 2C:
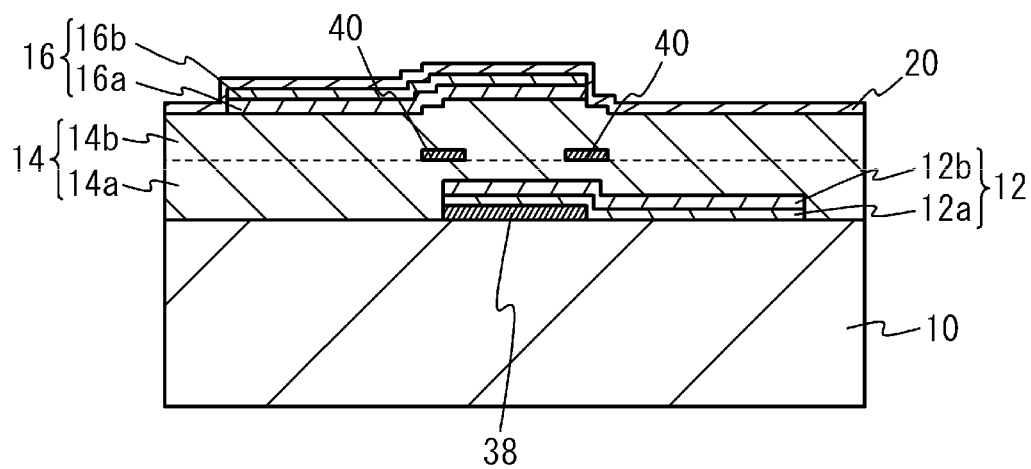

A description is now given of a method for fabricating a piezoelectric thin-film resonator while using the series resonator S as an example. FIGS. 2A through 2C are cross-sectional views that illustrate a method for fabricating the piezoelectric thin-film resonator according to the first embodiment. As illustrated in FIG. 2A, a sacrificing layer 38 for forming the air gap 30 is formed on the flat main surface of the substrate 10. The sacrificing layer 38 may be formed by sputtering, vacuum deposition, or CVD (Chemical Vapor Deposition), for example. The sacrificing layer 38 may be made of a substance that easily melts in etching liquid or etching gas, such as magnesium oxide (MgO), zinc oxide (ZnO), germanium (Ge) or silicon dioxide ($SiO_2$). The thickness of the sacrificing layer 38 may be 10 nm to 100 nm, for example. Thereafter, the sacrificing layer 38 is patterned into a desired shape by the photolithography and etching techniques. The shape of the sacrificing layer 38 corresponds to the planar shape of the air gap 30, and includes an area that is to be finally the resonance region 32.

Next, the lower layer 12a and the upper layer 12b of the lower electrode 12 are formed on the sacrificing layer 38 and the substrate 10. The lower electrode 12 may be formed by sputtering, vacuum deposition or CVD, for example. Then, the lower electrode 12 is patterned into a desired shape by the photolithography and etching techniques. The lower electrode 12 may be formed by liftoff.

As illustrated in FIG. 2B, a piezoelectric film 14a is formed on the lower electrode 12 and the substrate 10. The piezoelectric film 14a may be formed by sputtering, vacuum deposition or CVD, for example. A sacrificing layer 40 for forming the air space 18 is formed on the piezoelectric film 14a. The sacrificing layer 40 may be formed by sputtering, vacuum deposition or CVD, for example. The sacrificing layer 40 may be made of the same substance as that of the sacrificing layer 38. The thickness of the sacrificing layer 40 may be approximately 150 nm, for example. After that, the sacrificing layer 40 is patterned into a desired shape by the photolithography and etching techniques. The shape of the sacrificing layer 40 is a shape that corresponds to the planar shape of the air space 18. The sacrificing layer 40 may be formed by liftoff.

As illustrated in FIG. 2C, a piezoelectric film 14b is formed on the sacrificing layer 40 and the piezoelectric film 14a. The piezoelectric film 14b may be formed by sputtering, vacuum deposition or CVD, for example. The piezoelectric films 14a and 14b form the piezoelectric film 14. On the piezoelectric film 14, formed are the lower layer 16a and the upper layer 16b of the upper electrode 16. The upper electrode 16 may be formed by sputtering, vacuum deposition or CVD, for example. Then, the upper electrode 16 is patterned into a desired shape by the photolithography and etching techniques. The upper electrode 16 may be formed by liftoff. The frequency adjustment film 20 is formed on the upper electrode 16 by sputtering or CVD, for example.

In the parallel resonator in FIG. 1C, after the lower layer 16a of the upper electrode 16 is formed, the mass load film 26 is formed by sputtering, vacuum deposition or CVD, for example. The mass load film 26 is patterned into a desired shape by the photolithography and etching techniques. After that, the upper layer 16b of the upper electrode 16 is formed.

After the frequency adjustment film 20 is formed, etching liquid is introduced into the sacrificing layer 38 under the lower electrode 12 and the sacrificing layer 40 under the piezoelectric film 14 through the aperture 24 and the introduction paths 22 (see FIG. 1A). Thus, the sacrificing layers 38 and 40 are removed. It is preferable that a medium for etching the sacrificing layers 38 and 40 does not etch the materials that form the structures of the resonator other than the sacrificing layers 38 and 40. For example, it is preferable that the etching medium does not etch the lower electrode 12 and the piezoelectric film 14 that are exposed to the etching medium. The process conditions forming the multilayered film are appropriately selected so that compressive stress is exerted on the multilayered film including the lower electrode 12, the piezoelectric film 14 and the upper electrode 16. For example, in sputtering, biasing or discharge gas pressure is appropriately selected. After the sacrificing layer 38 is removed, the multilayered film bulges so as to be away from the substrate 10. Through the above process, the air gap 30 having a dome-shaped bulge is formed between the substrate 10 and the lower electrode 12. At the same time as the air gap 30 is formed, the air space 18 is formed within the piezoelectric film 14. The method for fabricating the piezoelectric thin-film resonator of the first embodiment includes the steps described above.

A description is now given of a simulation for the piezoelectric thin-film resonator of the first embodiment conducted by the inventors. The inventors conducted a simulation by the finite element method directed to investigating the influence of the length L of the air space 18 in the direction parallel to the flat main surface of the substrate 10 within the resonance region 32 of the piezoelectric thin-film resonator of the first embodiment on the Q value at the anti-resonance point and the effective electromechanical coupling coefficient. The thickness and material of each film of the multilayered film of the piezoelectric thin-film resonator used in the simulation were the same as those of the aforementioned piezoelectric thin-film resonator having a resonance frequency of 2 GHz. The height of the air space 18 was 150 nm, and the width W of the overlap between the resonance region 32 and the air space 18 (see FIG. 1B) was changed between 1.5 µm and 6.0 µm. A length L of the air space 18 outside of the resonance region 32 (see FIG. 1B) was 3 µm.

Figure 3A:
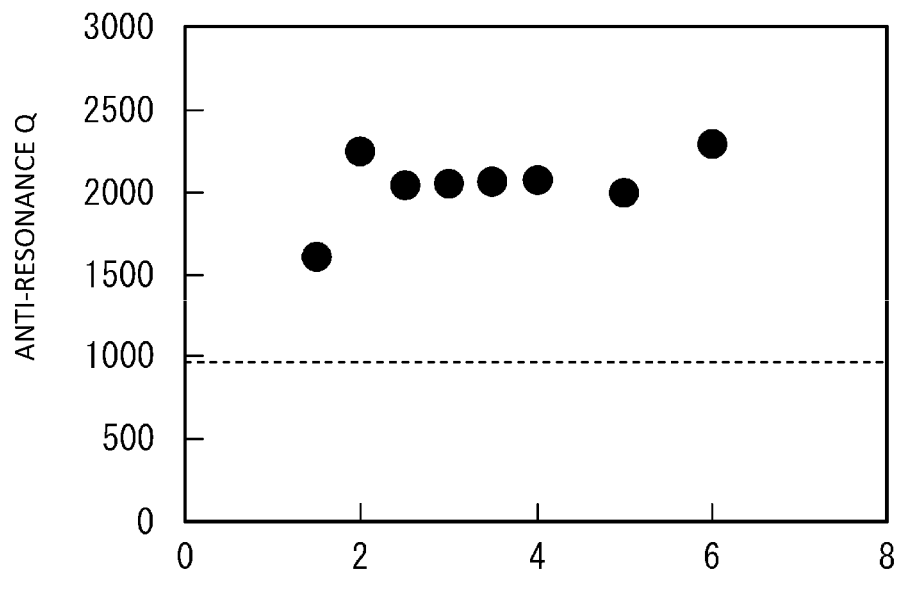
FIG. 3A is a diagram of a result of simulation for the Q value at an anti-resonance point.
Figure 3B:
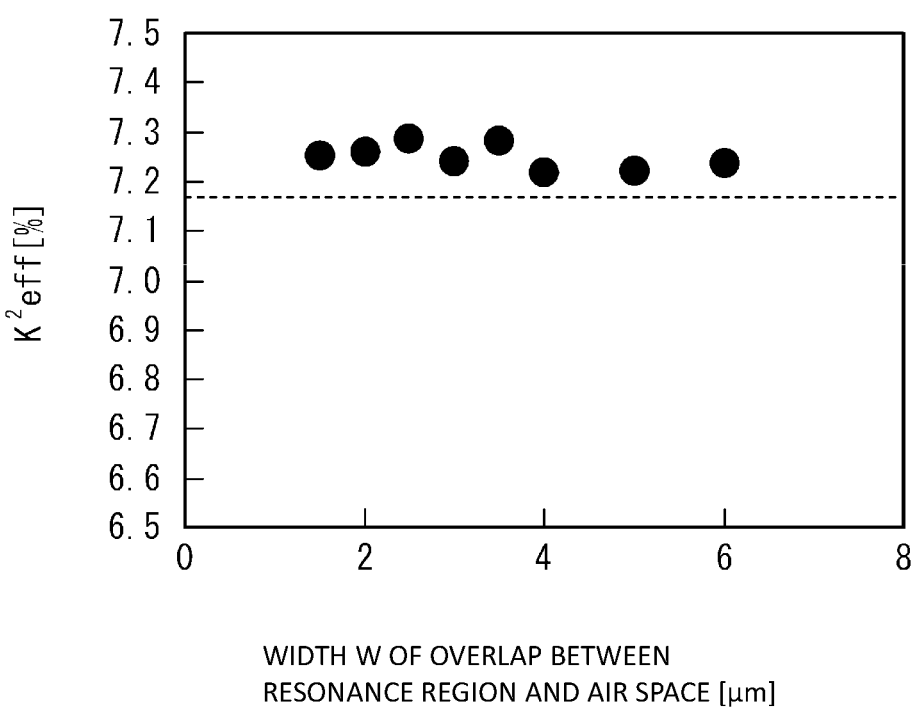
FIG. 3B is a diagram of a result of simulation for the effective electromechanical coupling coefficient $k^2$eff.

FIG. 3A illustrates a result of simulation for the Q value at the anti-resonance, and FIG. 3B illustrates a result of simulation for the effective electromechanical coupling coefficient $k^2$eff. The simulation result of the first embodiment are indicated by filled circles. For comparison, a broken line indicates a simulation result of a piezoelectric thin-film resonator of a comparative example having the same structure as the first embodiment except that the air space 18 is not formed in the piezoelectric film 14. It is seen from FIG. 3A that the air space 18 formed in the piezoelectric film 14 improves the Q value at the anti-resonance frequency. It is understood that the air space 18 suppresses leakage of the acoustic wave energy to the outside of the resonance region 32. Further, it is seen from FIG. 3B that the air space 18 formed in the piezoelectric film 14 improves the effective electromechanical coupling coefficient $k^2$eff. The width W of the overlap between the air space 18 and the resonance region 32 is preferably not less than 1.5 µm is more preferably not less than 2.0 µm.

A description is now given of a simulation conducted by the inventors by the finite element method and directed to investigating the influence of the length L of the air space 18 outside of the resonance region 32 on the Q value and the effective electromechanical coupling coefficient at the anti-resonance point. The thickness and material of each film of the multilayered film of the piezoelectric thin-film resonator used in the simulation were the same as those of the aforementioned piezoelectric thin-film resonator having a resonance frequency of 2 GHz. The height of the air space 18 was 150 nm, and the length L of the air space 18 outside of the resonance region 32 was changed to −1.0 µm, 0 µm and 3.0 µm. The width W of the overlap between the resonance region 32 and the air space 18 (see FIG. 1B) was 2.5 µm. It is noted that a minus value of the length L of the air space 18 outside of the resonance region 32 means that the air space 18 is formed within the resonance region 32 only.

Figure 4A:
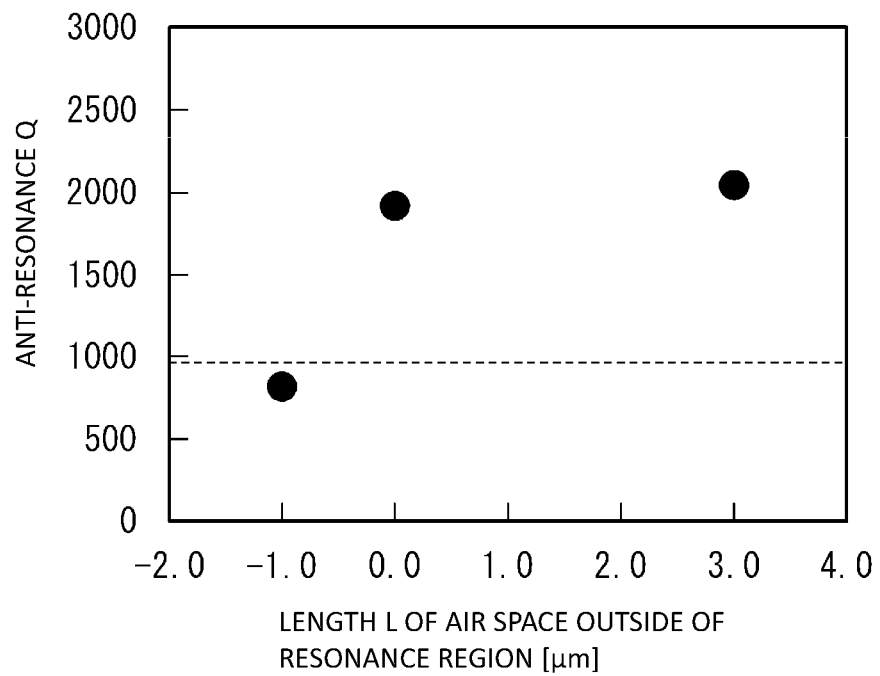
FIG. 4A is a diagram of a result of simulation for the Q value at an anti-resonance point.
Figure 4B:
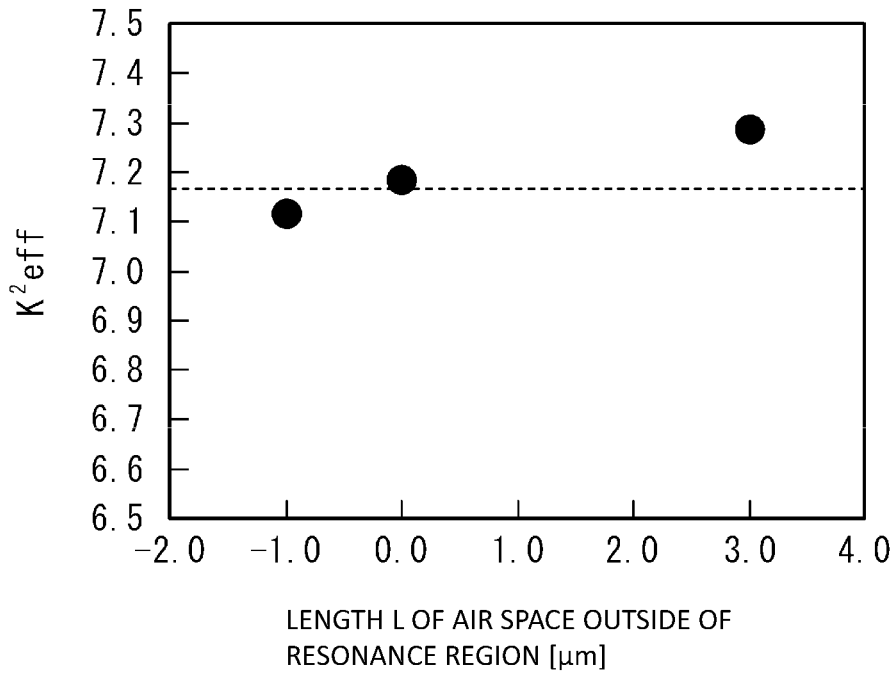
FIG. 4B is a diagram of a result of simulation for the effective electromechanical coupling coefficient $k^2$eff.

FIG. 4A illustrates a result of simulation for the Q value at the anti-resonance, and FIG. 4B illustrates a result of simulation for the effective electromechanical coupling coefficient $k^2$eff. The simulation result of the first embodiment are indicated by filled circles. For comparison, a broken line indicates a simulation result of the piezoelectric thin-film resonator of the above-described comparative example. It is seen from FIG. 4A that the Q value at the anti-resonance frequency is improved by extending the air space 18 up to the circumference of the resonance region 32 or beyond the resonance region 32. It is seen from FIG. 4B that the effective electromechanical coupling coefficient is improved by extending the air space 18 up to the circumference of the resonance region 32 or beyond the resonance region 32. The length L of the air space 18 outside of the resonance region 32 is preferably not less than 1.0 µm and is more preferably not less than 3.0 µm.

According to the first embodiment, the air space 18 is formed in the piezoelectric film 14 so as to be provided in at least part of the outer circumferential part 34 in the resonance region 32 and is not provided in the central part 36. It is thus possible to suppress the leakage of the acoustic wave energy to the outside of the resonance region 32. As a result of this suppression, as illustrated in FIG. 3A, the improvement of the Q value is achieved. Further, as illustrated in FIG. 3B, the improvement of the effective electromechanical coupling coefficient is achieved.

As illustrated in FIGS. 1A through 1C, it is preferable that the air space 18 within the piezoelectric film 14 extends from the outer circumferential part 34 within the resonance region 32 to the outside of the resonance region 32. It is thus possible to much further improve the Q value and the effective electromechanical coupling coefficient as illustrated in FIGS. 4A and 4B.

The air space 18 within the piezoelectric film 14 has the effect of suppression of the leakage of the acoustic wave energy by forming the air space 18 in at least part of the outer circumferential part 34 within the resonance region 32. However, in order to suppress the leakage more effectively, it is preferable to form the air space over the whole circumference of the outer circumferential part 34 within the resonance region 32.

Second Embodiment

Figure 5A:
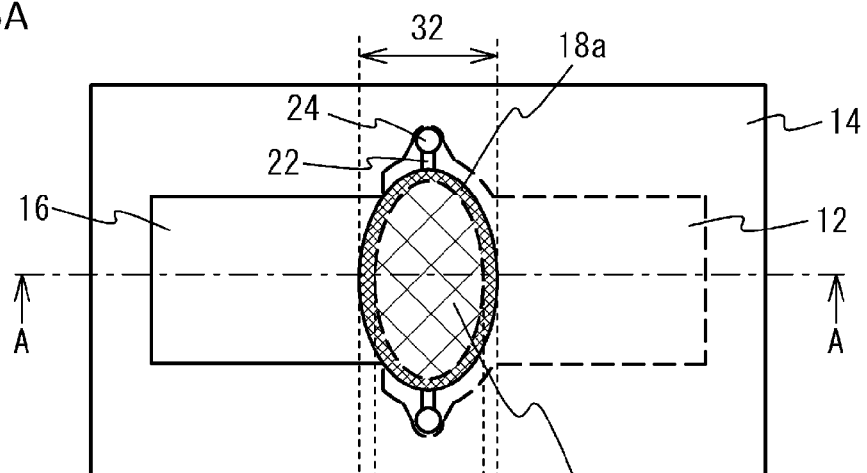
FIG. 5A is a top view of a piezoelectric thin-film resonator in accordance with a second embodiment.
Figure 5B:
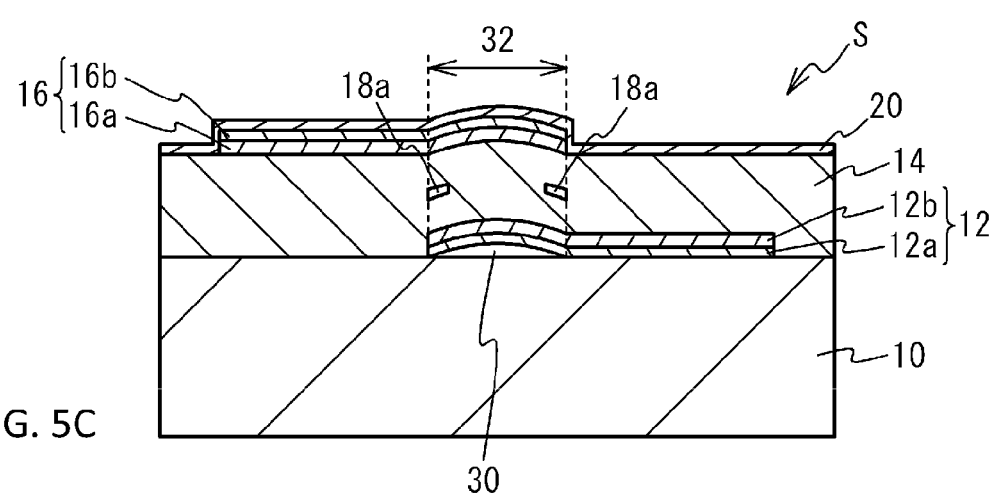
FIGS. 5B and 5C are cross-sectional views taken along a line A-A in FIG. 5A.
Figure 5C:
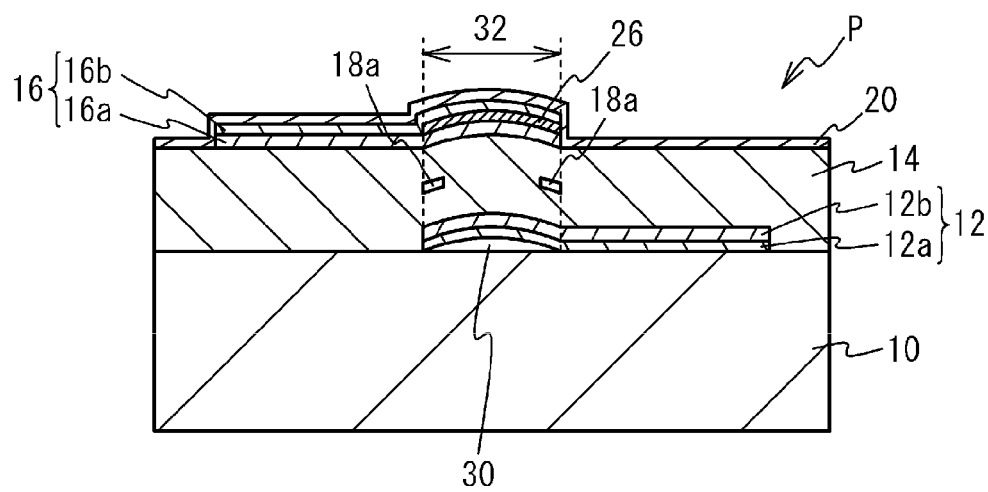

FIG. 5A is a top view of a piezoelectric thin-film resonator in accordance with a second embodiment, and FIGS. 5B and 5C are respectively cross-sectional views taken along a line A-A in FIG. 5A. FIG. 5B is a cross-sectional view of a series resonator of a ladder filter, and FIG. 5C is a cross-sectional view of a parallel resonator of the ladder filter, for example. As illustrated in FIGS. 5A through 5C, an air space 18$a$ within the piezoelectric film 14 is provided in only the outer circumferential part 34 within the resonance region 32, and does not extend to the outside of the resonance region 32. The other structures of the second embodiment are the same as those of the first embodiment illustrated in FIGS. 1A through 1C, and a description thereof is omitted here.

According to the second embodiment, the air space 18$a$ within the piezoelectric film 14 is provided in only the outer circumferential part 34 within the resonance region 32, and does not extend to the outside of the resonance region 32. Even with this structure, it is possible to improve the Q value and the effective electromechanical coupling coefficient, as illustrated in FIGS. 4A and 4B.

Third Embodiment

Figure 6A:
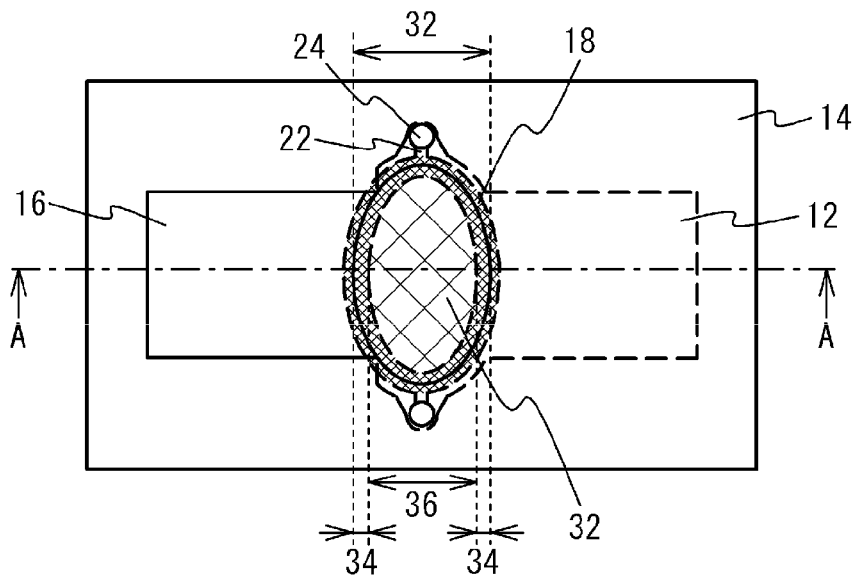
FIG. 6A is top view of a piezoelectric thin-film resonator in accordance with a third embodiment.
Figure 6B:
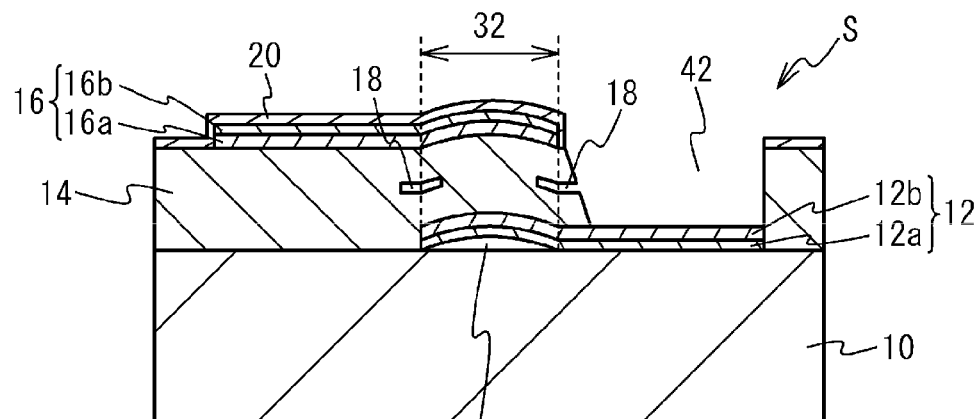
FIGS. 6B and 6C are cross-sectional views taken along a line A-A in FIG. 6A.
Figure 6C:
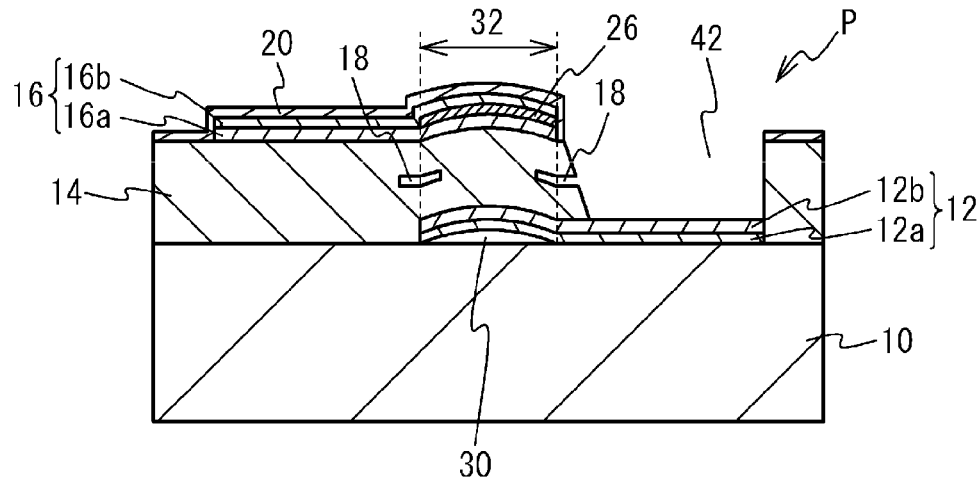

FIG. 6A is a top view of a piezoelectric thin-film resonator in accordance with a third embodiment, and FIGS. 6B and 6C are respective cross-sectional views taken along a line A-A in FIG. 6A. FIG. 6B is a cross-sectional view of a series resonator of a ladder filter, and FIG. 6C is a cross-sectional view of a parallel resonator of the ladder filter, for example. As illustrated in FIGS. 6A through 6C, an opening 42 is formed by removing a part of the piezoelectric film 14 to expose an extraction part of the lower electrode 12. The air space 18 within the piezoelectric film 14 communicates with the opening 42. The other structures are the same as those of the first embodiment illustrated in FIGS. 1A through 1C, and a description thereof is omitted here.

According to the third embodiment, the piezoelectric film 14 has the opening 42 on the lower electrode 12, which communicates with the air space 18 within the piezoelectric film 14. With this structure, the air space 18 may be formed by forming the opening 42 by etching the piezoelectric film 14 and removing the sacrificing layer for forming the air space 18 from the opening 42.

Fourth Embodiment

Figure 7A:
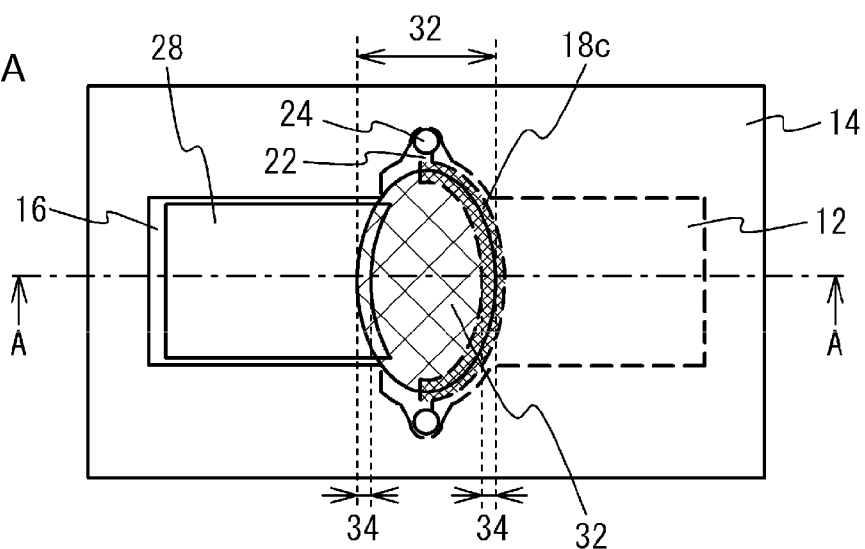
FIG. 7A is a top view of a piezoelectric thin-film resonator in accordance with a fourth embodiment.
Figure 7B:
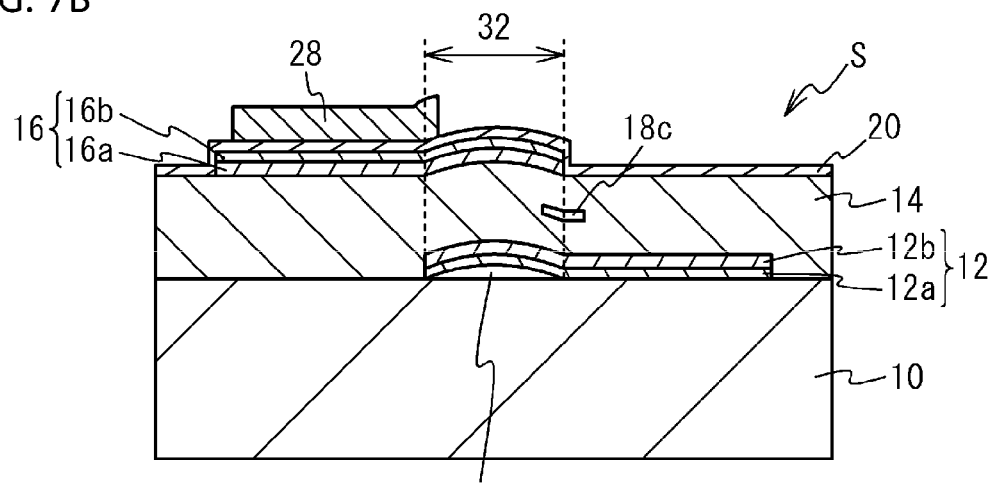
FIGS. 7B and 7C are cross-sectional views taken along a line A-A in FIG. 7A.
Figure 7C:
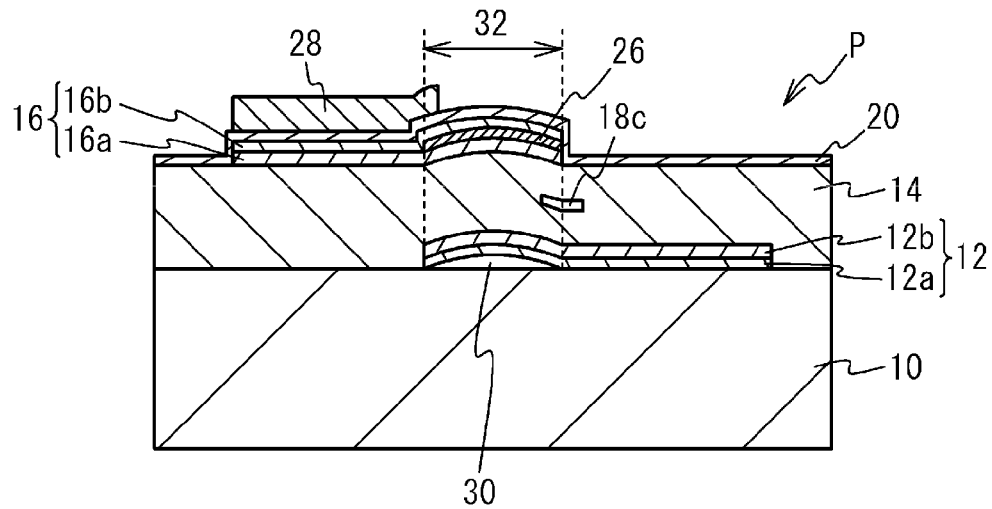

FIG. 7A is a top view of a piezoelectric thin-film resonator in accordance with a fourth embodiment, and FIGS. 7B and 7C are respectively cross-sectional views taken along a line A-A in FIG. 7A. FIG. 7B is a cross-sectional view of a series resonator of a ladder filter, and FIG. 7C is a cross-sectional view of a parallel resonator of the ladder filter, for example. As illustrated in FIGS. 7A through 7C, an air space 18$c$ within the piezoelectric film 14 is provided in only a part of the outer circumferential part 34 in the resonance region 32, which part is located on the extraction part side of the lower electrode 12. An additional film 28 is provided on the upper electrode 16. The additional film 28 is provided so as to a part of the outer circumferential part 34 on the extraction part side of the upper electrode 16. The additional film 28 is a multilayered metal film in which a Ti film and an Au film are stacked in this order from the upper electrode 16 side. The additional film may be made of another metal. The other structures are the same as those illustrated in FIGS. 1A through 1C, and a description thereof is omitted here.

According to the fourth embodiment, the air space 18$c$ within the piezoelectric film 14 is provided in only a part of the outer circumferential part 34 within the resonance region 32, and the additional film 28 is provided on the upper electrode 16 in another part of the outer circumferential part 34. The additional film 28 suppresses the leakage of the acoustic wave energy to the outside of the resonance region 32 as the air space 18$c$ does. The structure of the fourth embodiment is capable of improving the Q value. In terms of suppression of the leakage of the acoustic wave energy, the air space 18$c$ and the additional film 28 are preferably provided so as to surround the whole circumference of the resonance region 32. However, the effect of suppression of the acoustic wave energy is available even when only part of the circumference of the resonance region 32 is surrounded. Further, the additional film 28 made of a metal on the upper electrode 16 advantageously reduces the wiring resistance of the upper electrode 16.

Fifth Embodiment

Figure 8A:
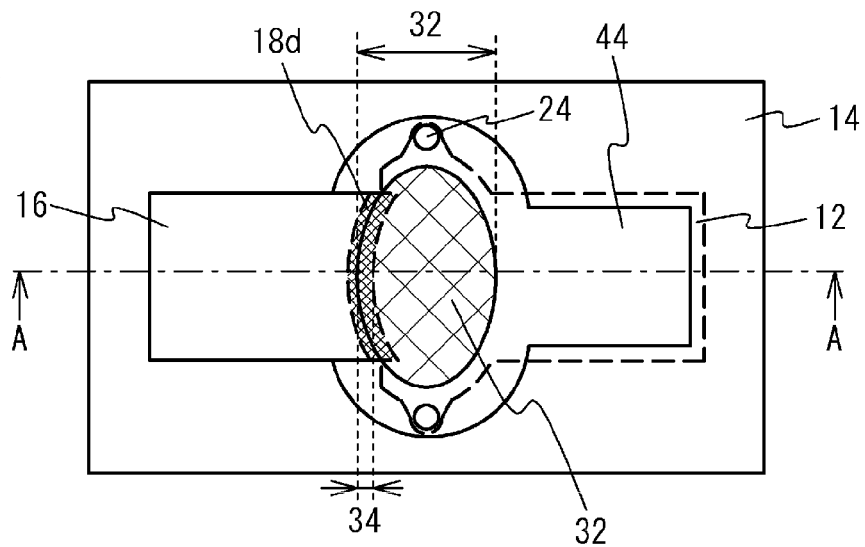
FIG. 8A is top view of a piezoelectric thin-film resonator in accordance with a fifth embodiment.
Figure 8B:
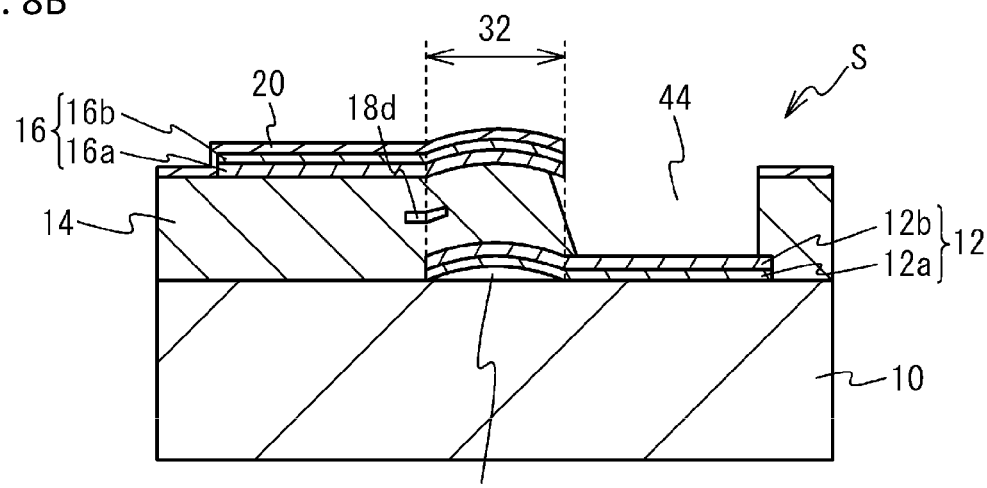
FIGS. 8B and 8C are cross-sectional views taken along a line A-A in FIG. 8A.
Figure 8C:
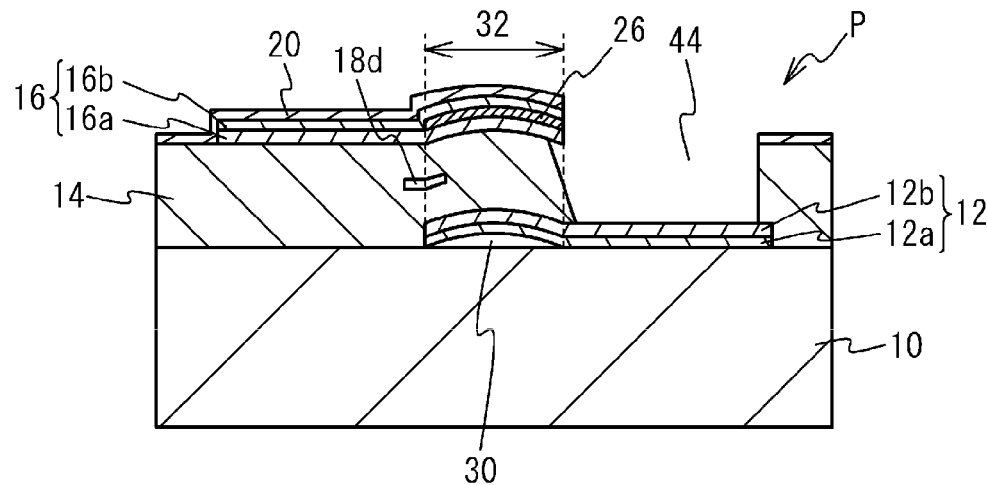

FIG. 8A is a top view of a piezoelectric thin-film resonator in accordance with a fifth embodiment, and FIGS. 8B and 8C are respectively cross-sectional views taken along a line A-A in FIG. 8A. FIG. 8B is a cross-sectional view of a series resonator of a ladder filter, and FIG. 8C is a cross-sectional view of a parallel resonator of the ladder filter, for example. As illustrated in FIGS. 8A through 8C, an air space 18$d$ within the piezoelectric film 14 is provided in only part of the outer circumferential part 34 within the resonance region 32, which part is located on the extraction part side of the upper electrode 16 in the resonance region 32. An opening 44 is formed by removing a part of the piezoelectric film 14 around the resonance region 32 except for another part thereof below the upper electrode 16. The piezoelectric film 14 is removed so that an edge of the upper electrode 16 is like eaves. The air space 18$d$ is formed by etching the piezoelectric film 14 to form the opening 44 and removing the sacrificing layer for forming the air space 18$d$ from the opening 44. The other structures are the same as those of the first embodiment illustrated in FIGS. 1A through 1C, and a description thereof is omitted here.

According to the fifth embodiment, the air space 18d within the piezoelectric film 14 is provided in only part of the outer circumferential part 34 in the resonance region 32. The piezoelectric film 14 has the opening 44 located in the outside of the outer circumferential part 34 in the resonance region 32 in which the air space 18d is not provided. The opening 44 suppresses the leakage of the acoustic wave energy to the outside of the resonance region 32 as the air space 18d does. Thus, the structure of the fifth embodiment improves the Q value. In terms of suppression of the leakage of the acoustic wave energy, the air space 18d and the opening 44 are preferably provided so as to surround the whole circumference of the resonance region 32. However, the effect of suppression of the acoustic wave energy is available even when only part of the circumference of the resonance region 32 is surrounded.

Sixth Embodiment

Figure 9:
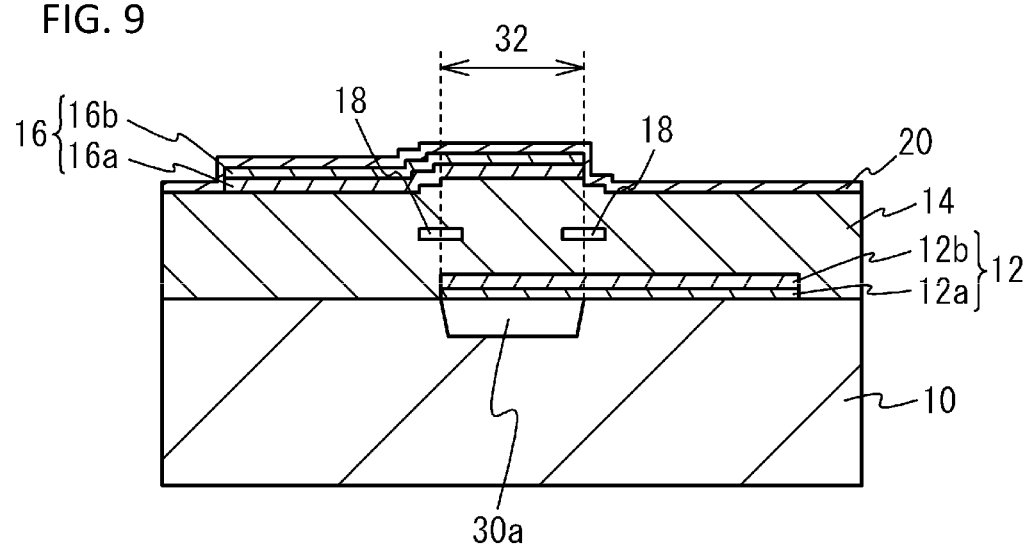
FIG. 9 is a cross-sectional view of a piezoelectric thin-film resonator in accordance with a sixth embodiment.

A sixth embodiment has an exemplary structure having an air gap under the lower electrode 12 that is different from that in the first embodiment. FIG. 9 is a cross-sectional view of a piezoelectric thin-film resonator in accordance with the sixth embodiment. As illustrated in FIG. 9, a recess is formed in the main surface of the substrate 10. The lower electrode 12 is flat on the main surface of the substrate 10. Thus, the recess in the substrate 10 functions as an air gap 30a. The air gap 30a is formed so as to include the resonance region 32. The other structures are the same as those of the first embodiment illustrated in FIGS. 1A and 1B, and a description thereof is omitted here. The air gap 30a may be formed to pierce the substrate 10. As illustrated in FIG. 1C, the mass load film 26 may be provided.

The sixth embodiment employs the air gap 30a instead of the air gap 30 of the first embodiment. The air gap 30a may be substituted for the air gap 30 of the second through fifth embodiments.

Seventh Embodiment

Figure 10:
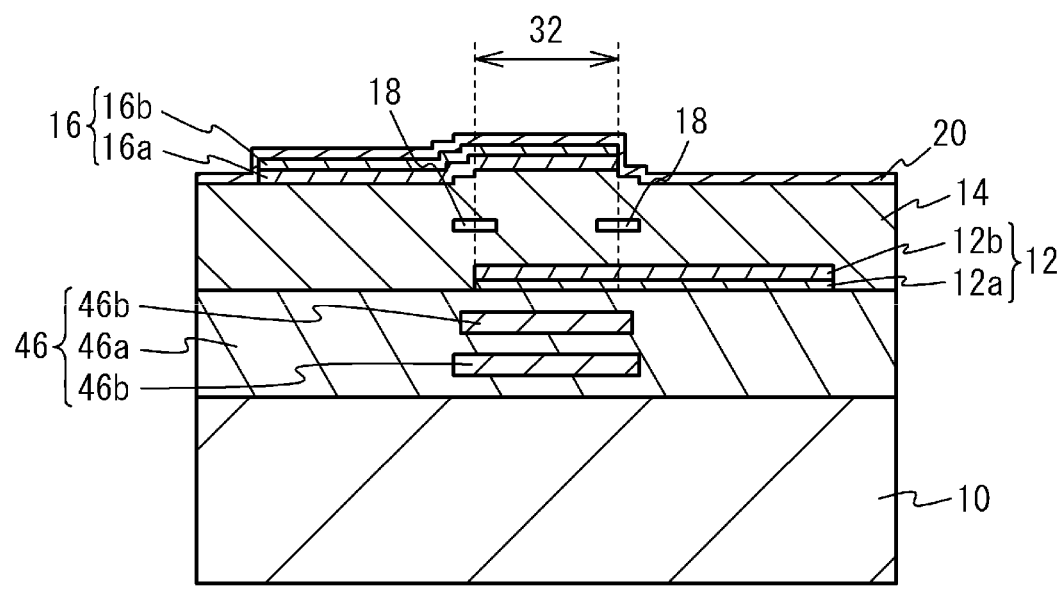
FIG. 10 is a cross-sectional view of a piezoelectric thin-film resonator in accordance with a seventh embodiment.

A seventh embodiment has an exemplary structure having an acoustic reflection film instead of the air gap. FIG. 10 is a cross-sectional view of a piezoelectric thin-film resonator in accordance with the seventh embodiment. Referring to FIG. 10, an acoustic reflection film 46 is provided below the lower electrode 12 in the resonance region 32. The acoustic reflection film 46 reflects acoustic waves propagated through the piezoelectric film 14. The acoustic reflection film 46 has films 46a having a relatively low acoustic impedance and films 46b having a relatively high acoustic impedance. The films 46a and 46b are stacked alternately one by one, and have a thickness equal to λ/4 where λ is the wavelength of the acoustic waves. The thicknesses of the films 46a and 46b may be appropriately changed in order to achieve a desired characteristic. An arbitrary number of the films 46a and 46b is appropriately selected. The other structures are the same as those of the first embodiment illustrated in FIGS. 1A through 1C, and a description thereof is omitted here. The mass load film 26 may be employed in the same manner as illustrated in FIG. 1C.

The seventh embodiment employs the acoustic reflection film 46 instead of the air gap 30 of the first embodiment. The acoustic reflection film 46 may be substituted for the air gap 30 of the second through fifth embodiments.

The piezoelectric thin-film resonators of the first through sixth embodiments in which the air gap 30 or 30a is provided below the lower electrode 12 in the resonance region 32 are specifically called film bulk acoustic resonators (FBARs). The piezoelectric thin-film resonator of the seventh embodiment with the acoustic reflection film 46 below the lower electrode 12 in the resonance region 32 is specifically called a solidly mounted resonator (SMR).

The resonance regions 32 of the first through seventh embodiments are not limited to the elliptical shape but may have another shape such as a polygonal shape, which may be a rectangular shape or a pentagonal shape.

Eighth Embodiment

Figure 11:
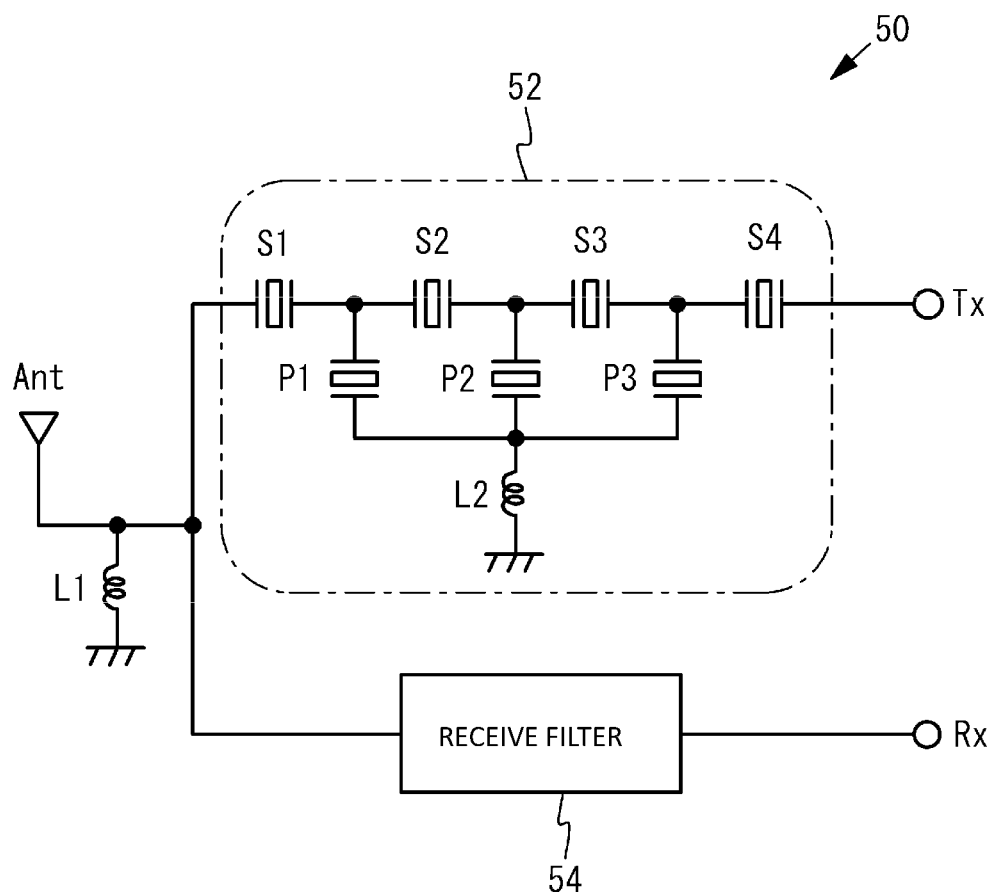
FIG. 11 is a circuit diagram of a duplexer in accordance with an eighth embodiment.

An eighth embodiment is an exemplary duplexer. FIG. 11 is a circuit diagram of a duplexer in accordance with the eighth embodiment. Referring to FIG. 11, a duplexer 50 is provided with a transmit filter 52 and a receive filter 54. The transmit filter 52 is connected between an antenna terminal Ant and a transmit terminal Tx. The receive filter 54 is connected the antenna terminal Ant shared with the transmit filter 52 and a receive terminal Rx. An inductor L1 is connected to the antenna terminal Ant and ground. The transmit filter 52 allows a transmit signal that is included in a signal applied to the transmit terminal Tx and is located in a transmit band to pass, and suppresses signals at other frequencies. The receive filter 54 allows a receive signal that is included in a signal input through the antenna terminal Ant and is located in a receive band, and suppresses signals at other frequencies. The inductor L1 is used for impedance matching directed to causing the transmit signal that has passed through the transmit filter 52 to be output through the antenna terminal without any leakage to the receive filter 54.

The transmit filter 52 is a ladder filter in which multiple piezoelectric thin-film resonators are connected in a ladder form having series resonators and parallel resonators. More specifically, multiple series resonators S1~S4 are connected in series between the transmit terminal Tx (input terminal) and the antenna terminal Ant (output terminal), and multiple parallel resonators P1~P3 are connected in parallel. The grounds of the parallel resonators P1~P3 are unified, and an inductor L2 is connected between the parallel resonators P1~P3 and a common ground. At least one of the series resonators S1~S4 and the parallel resonators P1~P3 may be the piezoelectric thin-film resonator of any of the first through seventh embodiments. In the following, a description will be given of an exemplary ladder filter in which the piezoelectric thin-film resonator of the first embodiment is applied to the series resonators S1~S4 and the parallel resonators P1~P3.

Figure 12:
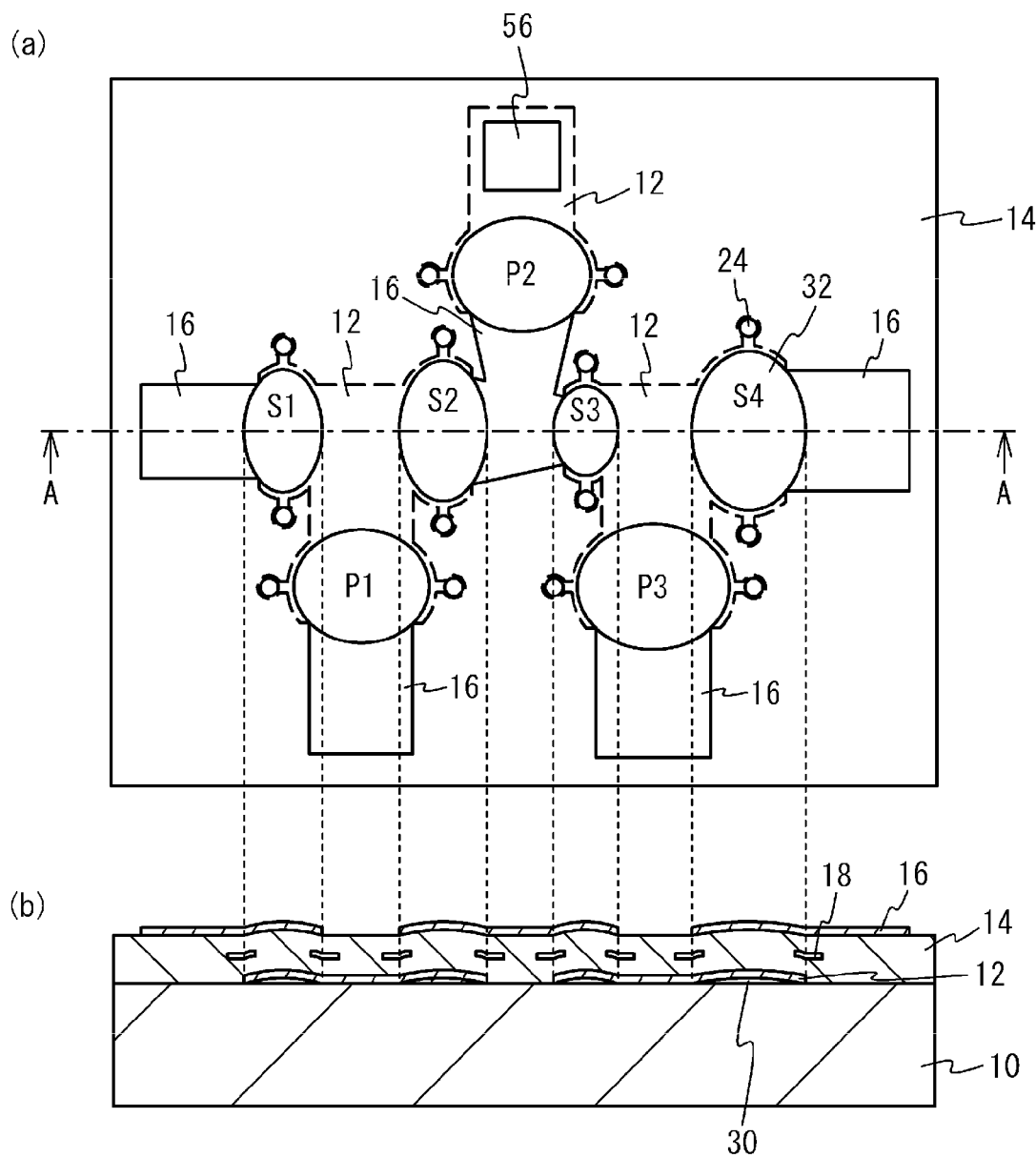
FIG. 12 includes a top view (a) of a transmit filter and a cross-sectional view (b) taken along a line A-A in part (a).

FIG. 12 is a top view of the transmit filter of the ladder filter referred to just above. A part (a) of FIG. 12 is a top view of the transmit filter, and a part (b) of FIG. 12 is a cross-sectional view taken along a line A-A. The frequency adjustment film 20 and the mass load film 26 are omitted for convenience of illustration. As illustrated in FIG. 12, the piezoelectric thin-film resonators of the first embodiment are formed in the single substrate 10 to assemble the ladder filter. An opening 56 is formed in the piezoelectric film 14, and is used for making an electric connection with the lower electrode 12. The other structures are the same as those of the first embodiment, and a description thereof is omitted here. According to the specifications, it is possible to appropriately select the number of series resonators, the number of parallel resonators, the shape and size of the resonance regions, the materials used to form the resonators and the film thicknesses.

According to the eighth embodiment, the transmit filter 52 includes the piezoelectric thin-film resonators of the first embodiment. It is thus possible to improve the Q value and improve the skirt characteristic of the filter.

The eighth embodiment is not limited to the transmit filter 52 of ladder type but may have another type of transmit filter such as a lattice filter. Similarly, the receive filter 54 may be composed of multiple piezoelectric thin-film resonators arranged in a ladder form, a lattice form or another form. At least one of the transmit filter 52 and the receive filter 54 may be composed of multiple piezoelectric thin-film resonators arranged in a ladder form, a lattice form or another form. At least one resonator of the transmit filter 52 and the receive filter 54 may be the piezoelectric thin-film resonator of any of the first through seventh embodiments.

The present invention is not limited to the specifically described embodiments, but may include other embodiments and variations without departing from the scope of the claimed invention.

What is claimed is:

1. A piezoelectric thin-film resonator comprising:
a substrate;
a piezoelectric film provided on the substrate; and
a lower electrode and an upper electrode that face each other through the piezoelectric film,
the piezoelectric film having an air space that is provided in at least part of an outer circumferential part of a resonance region in which the upper and lower electrodes face each other through the piezoelectric film and is not provided in a central part of the resonance region,
wherein the air space is exposed to neither an upper surface nor a lower surface of the piezoelectric film and is not located in a region other than the resonance region.

2. The piezoelectric thin-film resonator according to claim 1, wherein the air space is provided over the whole circumference of the outer circumferential part.

3. The piezoelectric thin-film resonator according to claim 1, wherein the air space is provided in a part of the outer circumferential part, and the piezoelectric thin-film resonator further comprises an additional film on the upper electrode in another part of the outer circumferential part.

4. The piezoelectric thin-film resonator according to claim 1, wherein the air space is provided in a part of the outer circumferential part, and the piezoelectric film includes an opening outside of another part of the outer circumferential part.

5. The piezoelectric thin-film resonator according to claim 1, wherein the piezoelectric film includes aluminum nitride as a principal component.

6. The piezoelectric thin-film resonator according to claim 1, wherein an air gap is formed between the substrate and the lower electrode in the resonance region.

7. The piezoelectric thin-film resonator according to claim 1, further comprising an acoustic reflection film below the lower electrode in the resonance region.

8. A filter comprising:
an input terminal;
an output terminal; and
a piezoelectric thin-film resonator according to claim 1 provided between the input terminal and the output terminal.

9. A duplexer comprising:
a transmit filter; and
a receive filter,
at least one of the transmit filter and the receive filter including a filter according to claim 8.

10. A piezoelectric thin-film resonator comprising:
a substrate;
a piezoelectric film provided on the substrate; and
a lower electrode and an upper electrode that face each other through the piezoelectric film,
the piezoelectric film having an air space that is provided in at least part of an outer circumferential part of a resonance region in which the upper and lower electrodes face each other through the piezoelectric film and is not provided in a central part of the resonance region,
wherein the piezoelectric film has an opening that is formed in a region other than the resonance region and exposes an upper surface of the lower electrode, and the air space is exposed to a side surface of the opening.

* * * * *